(12) United States Patent
Kawasaki

(10) Patent No.: US 8,575,952 B2
(45) Date of Patent: Nov. 5, 2013

(54) SEMICONDUCTOR DEVICE AND TEST METHOD

(75) Inventor: Kenichi Kawasaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 238 days.

(21) Appl. No.: 12/685,035

(22) Filed: Jan. 11, 2010

(65) Prior Publication Data

US 2010/0176838 A1    Jul. 15, 2010

(30) Foreign Application Priority Data

Jan. 15, 2009   (JP) .................................... 2009-6199

(51) Int. Cl.
*G01R 31/3187* (2006.01)

(52) U.S. Cl.
USPC ................................. 324/750.3; 324/762.01

(58) Field of Classification Search
None
See application file for complete search history.

(56) References Cited

U.S. PATENT DOCUMENTS

| | | | | |
|---|---|---|---|---|
| 6,310,487 B1 * | 10/2001 | Yokomizo | ................. | 324/750.3 |
| 6,693,448 B1 * | 2/2004 | Okada et al. | ................. | 324/750.3 |
| 6,930,504 B2 * | 8/2005 | Ishibashi | ................. | 324/750.3 |
| 7,005,865 B2 * | 2/2006 | Yakabe et al. | ................. | 324/686 |
| 7,050,920 B2 * | 5/2006 | Abe | ................. | 702/118 |
| 7,161,360 B2 * | 1/2007 | Hirota et al. | ................. | 324/688 |
| 7,280,380 B2 * | 10/2007 | Haraguchi | ................. | 365/51 |
| 8,013,625 B2 * | 9/2011 | Kawasaki | ................. | 324/762.01 |
| 2008/0212246 A1 * | 9/2008 | Tanaka et al. | ................. | 361/86 |
| 2012/0112563 A1 * | 5/2012 | Shido et al. | ................. | 307/147 |

FOREIGN PATENT DOCUMENTS

| | | |
|---|---|---|
| JP | 63-093142 | 4/1988 |
| JP | 1991-036748 | 2/1991 |
| JP | 1991-246944 | 11/1991 |
| JP | 1996-201474 | 8/1996 |
| JP | 2001-116805 | 4/2001 |
| JP | 2005-217299 | 8/2005 |
| JP | 2008-295078 | 12/2008 |

OTHER PUBLICATIONS

Japanese Office Action mailed Jul. 23, 2013 for corresponding Japanese Application No. 2009-006199, with English-language translation.

* cited by examiner

*Primary Examiner* — Richard Isla Rodas
(74) *Attorney, Agent, or Firm* — Fujitsu Patent Center

(57) ABSTRACT

A semiconductor device includes a first circuit block, a second circuit block, a first lead-out line coupled to the first circuit block, a second lead-out line coupled to the second circuit block, a first pad coupled to the first lead-out line, a second pad coupled to the second lead-out line, and a shielding line provided between the first lead-out line and the second lead-out line.

6 Claims, 17 Drawing Sheets

| TEST TIME | VDD | VSS | VDDMA | VDDMB | VDDMC |
|---|---|---|---|---|---|
| 100ms | 0 | 0 | TEST VOLTAGE | 0 | 0 |
| 100ms | 0 | 0 | 0 | TEST VOLTAGE | 0 |
| 100ms | 0 | 0 | 0 | 0 | TEST VOLTAGE |

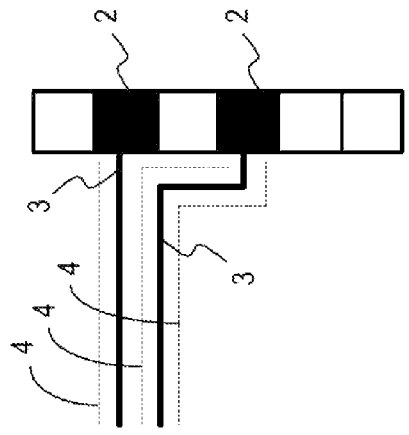
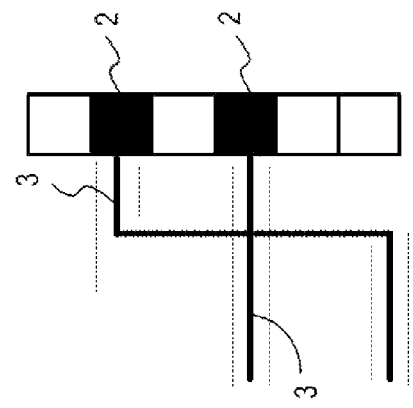
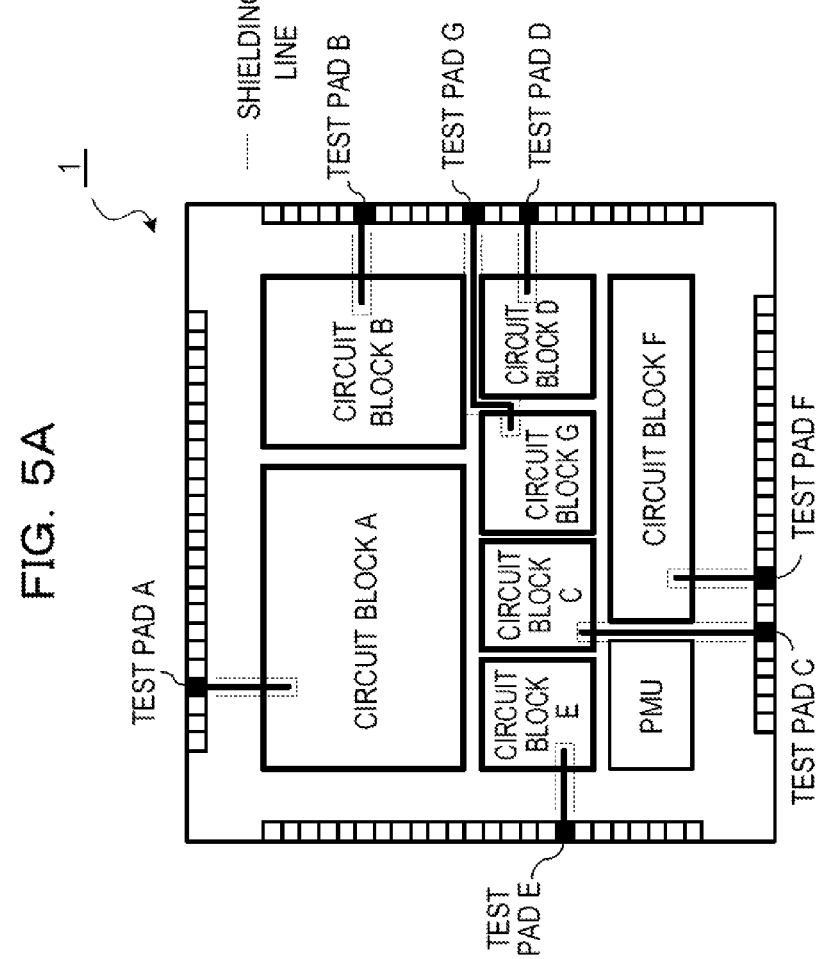

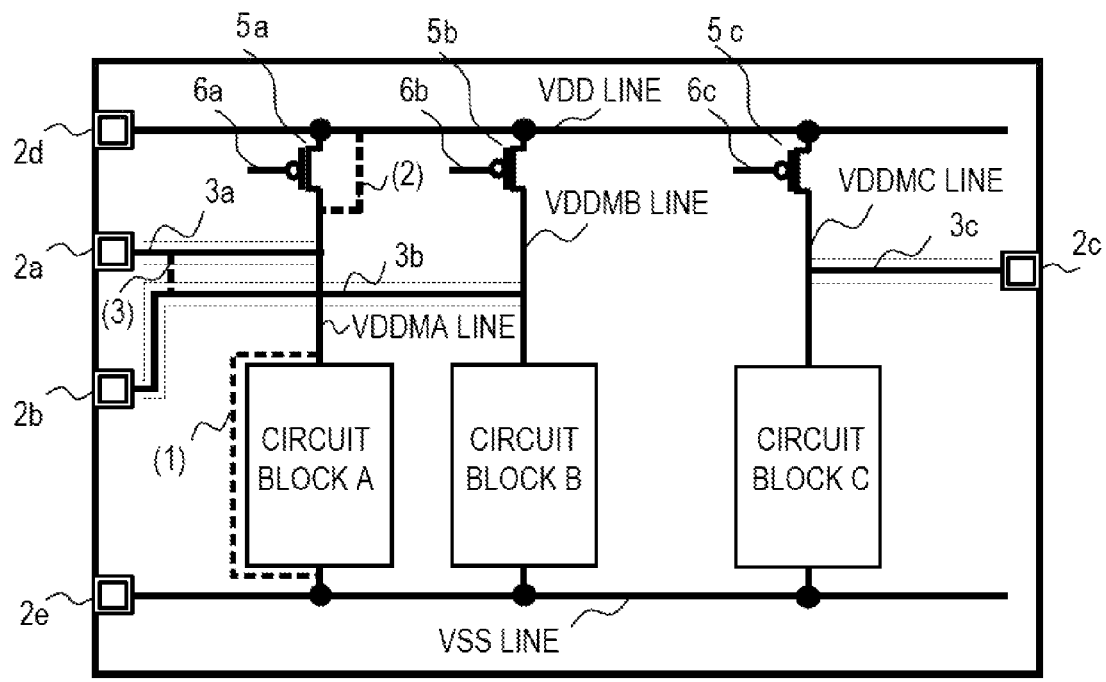

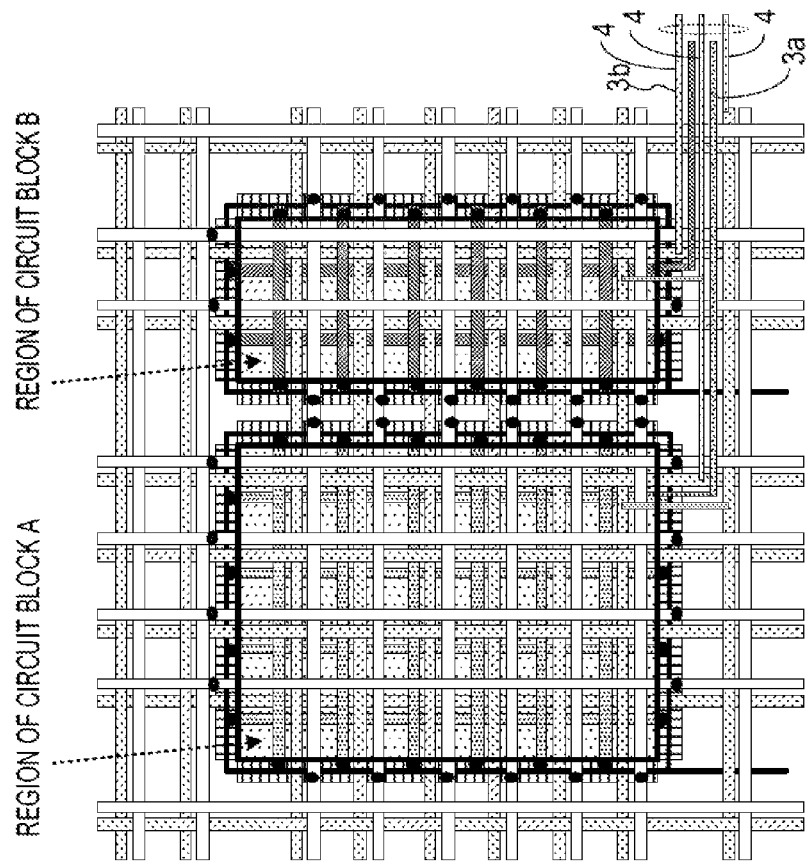
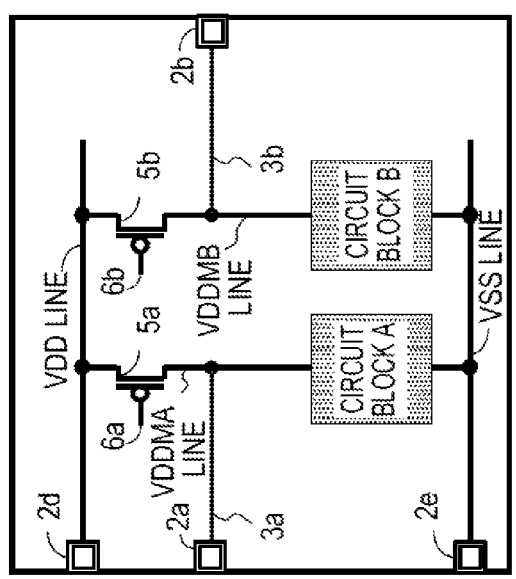
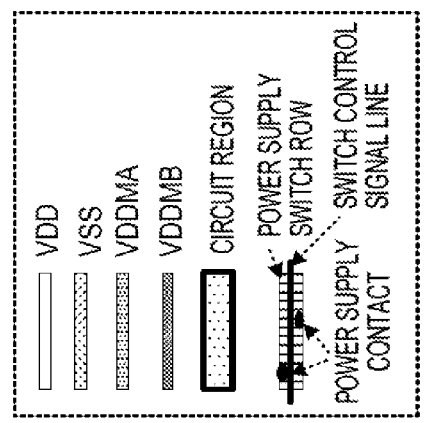
FIG. 9A
FIG. 9B

| TEST TIME | VDD | VSS | TEST PAD 12a | TEST PAD 12b | TEST PAD 12c |
|---|---|---|---|---|---|
| 100ms | 0 | 0 | TEST VOLTAGE 1 | TEST VOLTAGE 2 | TEST VOLTAGE 3 |

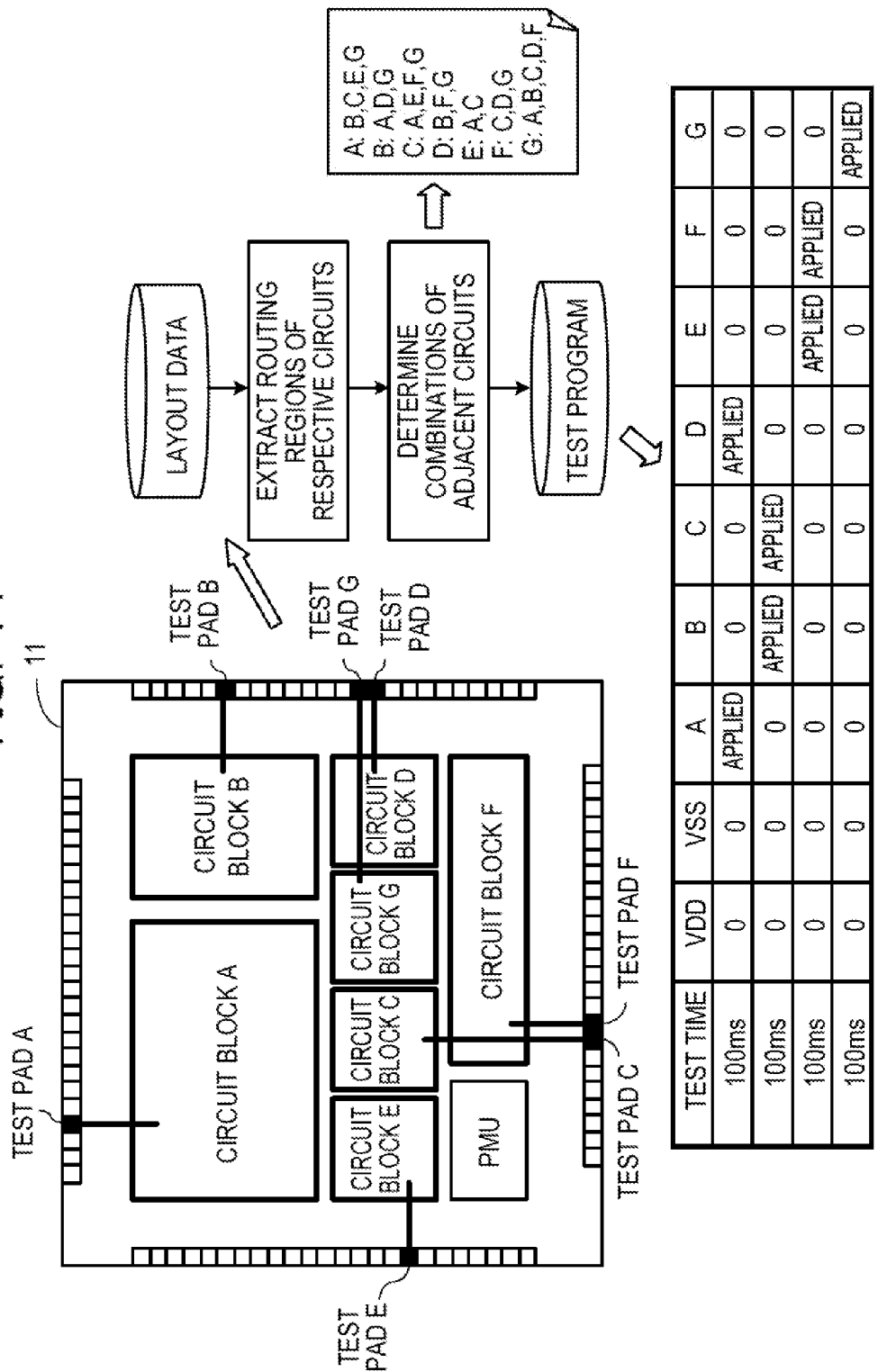

| TEST TIME | VSS | VDDA | VDDB | VDDC |
|---|---|---|---|---|
| 100ms | 0 | TEST VOLTAGE | 0 | 0 |
| 100ms | 0 | 0 | TEST VOLTAGE | 0 |
| 100ms | 0 | 0 | 0 | TEST VOLTAGE |

| TEST TIME | VSS | VDDA | VDDB | VDDC |
|---|---|---|---|---|
| 100ms | 0 | TEST VOLTAGE | TEST VOLTAGE | TEST VOLTAGE |

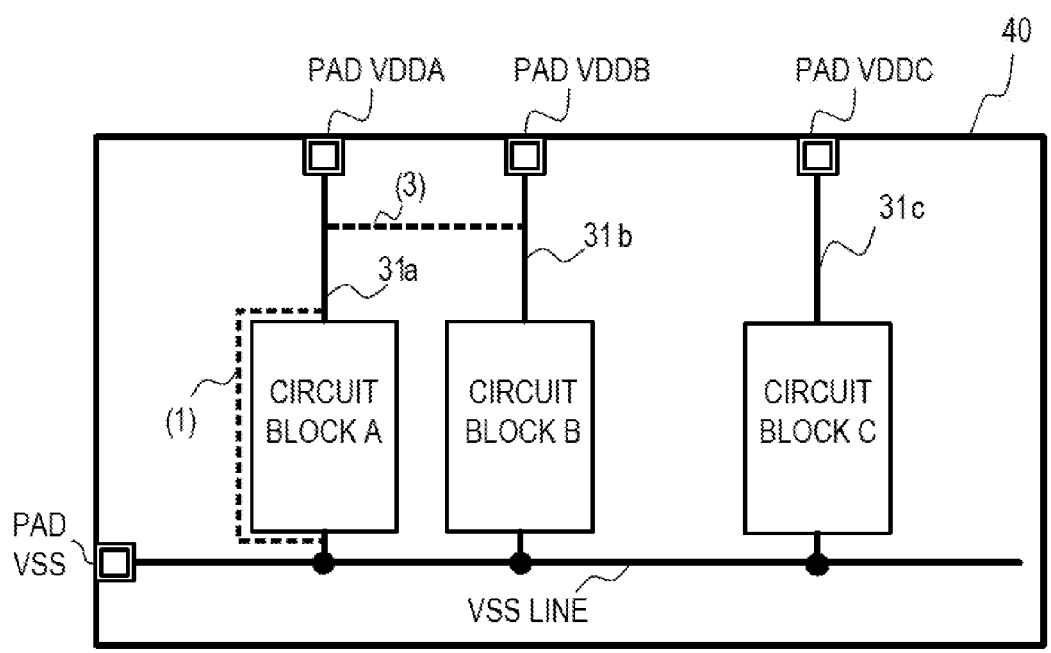

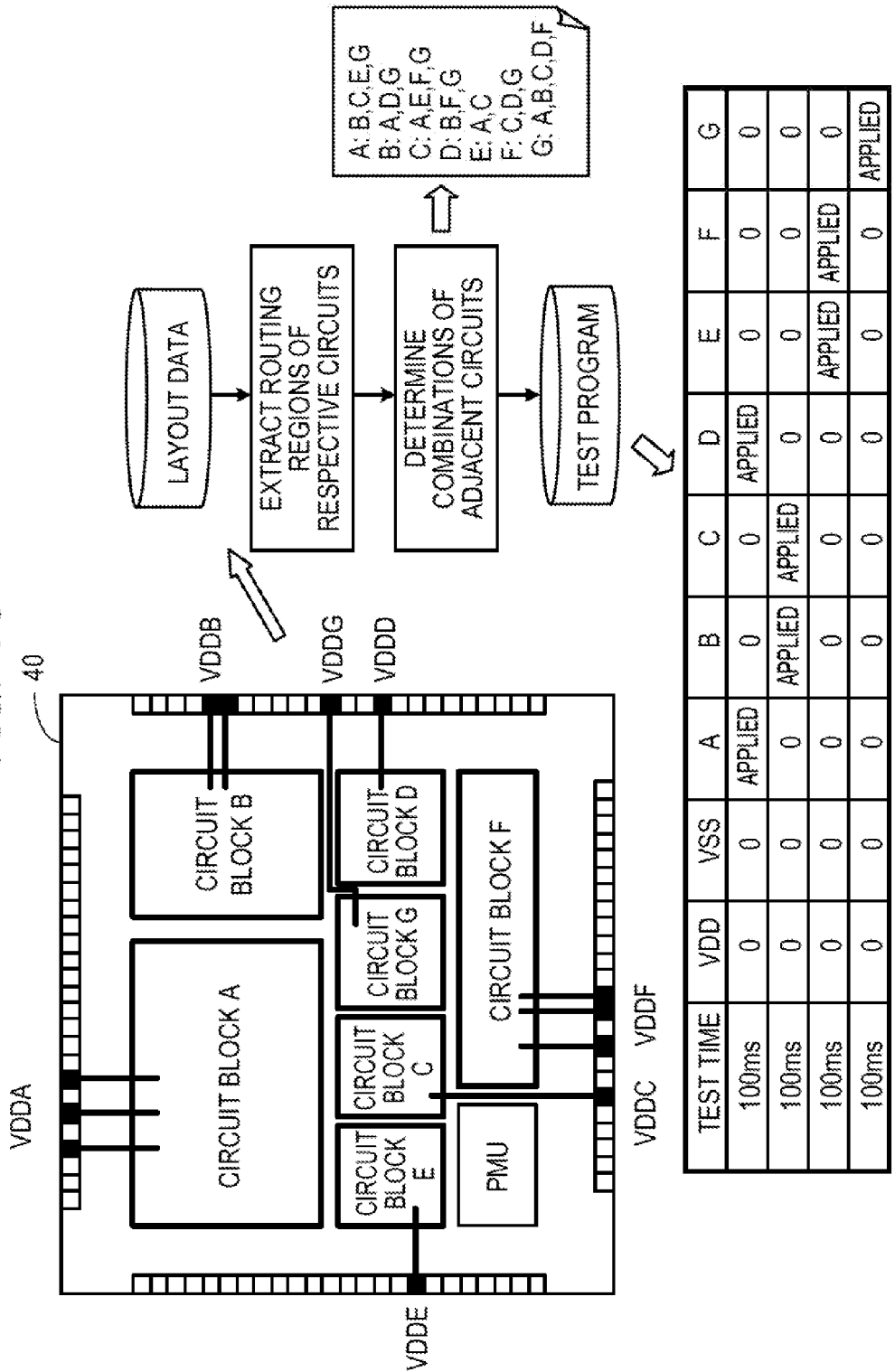

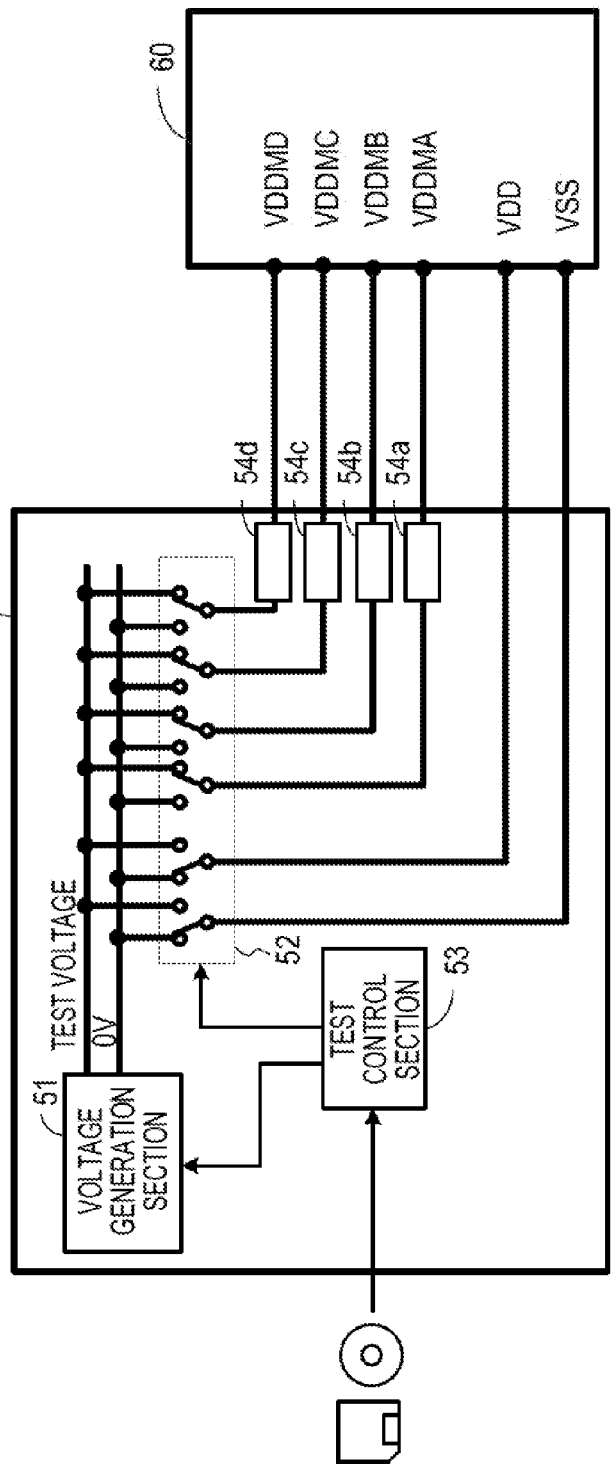

SEMICONDUCTOR DEVICE AND TEST METHOD

CROSS-REFERENCE TO RELATED APPLICATIONS

This application is based upon and claims the benefit of priority from the prior Japanese Patent Application No. 2009-6199, filed on Jan. 15, 2009, the entire contents of which is incorporated herein by reference.

FIELD

Embodiments of the present invention relate to a semiconductor device including a plurality of circuit blocks and a test method of the semiconductor device.

BACKGROUND

Test pads are generally provided on a semiconductor chip for testing an LSI. The testing using test pads is intended to detect the presence or absence of failures, such as short circuits among interconnects within a semiconductor chip. The testing may include applying voltages to the test pads and measuring currents generated or measuring a voltage between test pads. The testing is used to ensure required shipping quality.

Japanese Laid-open Patent Publication No. 3-36748 discloses a semiconductor device in which a switching element is provided midway along an interconnect and Japanese Laid-open Patent Publication No. 8-201474 discloses a semiconductor device in which a rectifying element is provided midway along an interconnect. In addition, Japanese Laid-open Patent Publication No. 3-246944 discloses examples of a layout of power supply pads and grounding pads in a semiconductor device and a method for interconnecting these pads.

An increase in the number of circuit blocks including in a semiconductor device results in an increase in the number of power supply lines for supplying power to the respective circuit blocks. Accordingly, the frequency of testing increases in proportion to the number of circuit blocks, thus increasing the amount of time required for conventionally detecting a failure in the semiconductor device.

In addition, as the result of a recent increase in the operating frequency of a semiconductor device and the miniaturization thereof, there is a demand for a reduction in power consumption. As a technique for reducing power consumption, there is a technique in which power supply switches are provided in respective circuit blocks included in a semiconductor device and power to circuits not in use or in low-power-mode is cut off. Hereinafter, this technique is referred to as a power-gating technique.

SUMMARY

According to an aspect of the invention, a semiconductor device includes a first circuit block, a second circuit block, a first lead-out line coupled to the first circuit block, a second lead-out line coupled to the second circuit block, a first pad coupled to the first lead-out line, a second pad coupled to the second lead-out line, and a shielding line provided between the first lead-out line and the second lead-out line.

An object and advantages of an embodiment of the invention will be realized and attained by elements and combinations of elements particularly pointed out in the claims. It is to be understood that both the foregoing general description and the following detailed description are explanatory and are not restrictive of the invention, as claimed.

BRIEF DESCRIPTION OF DRAWINGS

FIGS. 5A to 5C illustrate layouts of test pads and lead-out lines of a semiconductor device according to an example of an embodiment;

FIGS. 7A and 7B illustrate effects in an example of an embodiment;

FIGS. 9A and 9B illustrate circuit layouts of a semiconductor device according to an example of an embodiment;

FIG. 11 illustrates a second test method according to an example of an embodiment;

FIGS. 15A and 15B illustrate effects in a case where the first test method of an example of an embodiment is applied to a multiple power-driven semiconductor device;

FIG. 16 illustrates a case where the second test method of an example of an embodiment is applied to a multiple power-driven semiconductor device; and FIGS. 17A and 17B illustrate a testing apparatus and applied voltages according to an example of an embodiment.

DESCRIPTION OF EMBODIMENTS

Figure 1B:
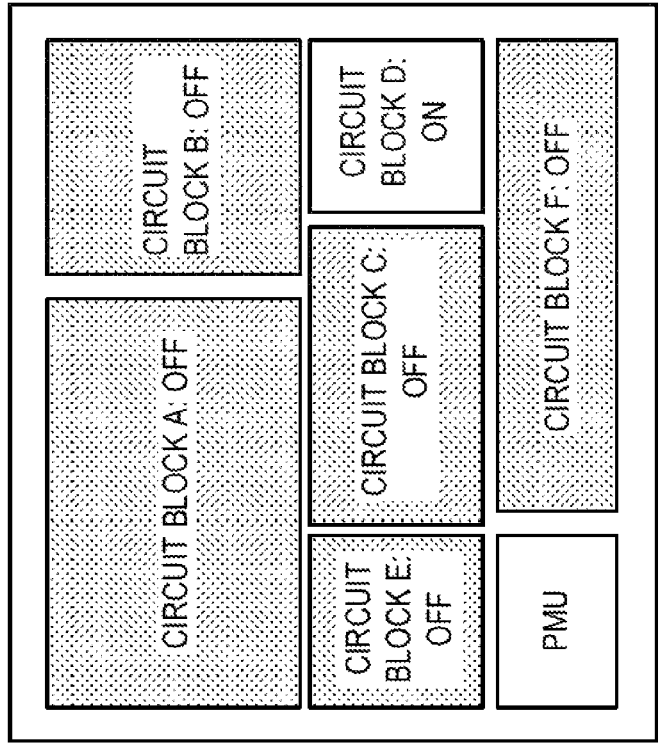
FIGS. 1A and 1B illustrate an overview of a power-gating technique.
Figure 1A:
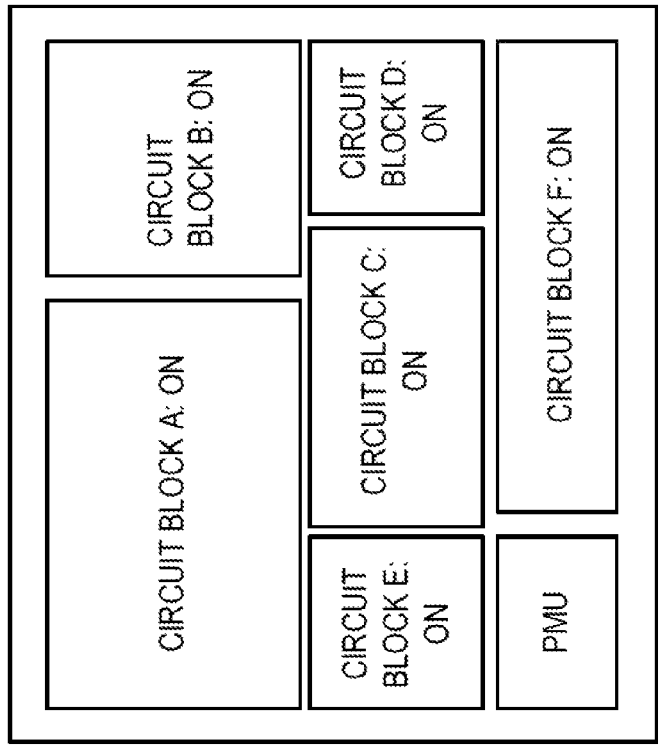

FIGS. 1A and 1B illustrate an overview of a power-gating technique. In FIG. 1A, a semiconductor device includes circuit blocks A to F and a Power Management Unit (PMU). FIG. 1A illustrates a condition in which all of the circuit blocks A to F within the semiconductor device 100 are in operation and power is supplied to all of the circuit blocks. FIG. 1B illustrates a condition in which only some of the circuit blocks within the semiconductor device 100 are in operation. For example, in FIG. 1B, power is supplied only to one circuit block, which is the circuit block D here, in need of power supply. Therefore, a power supply switch (not illustrated) provided between a power supply line and the circuit block D is turned on. In contrast, power supply switches provided between power supply lines and the other circuit blocks, which are the circuit blocks A to C and E and F here, are turned off. Thus, power consumption may be suppressed.

Figure 2:
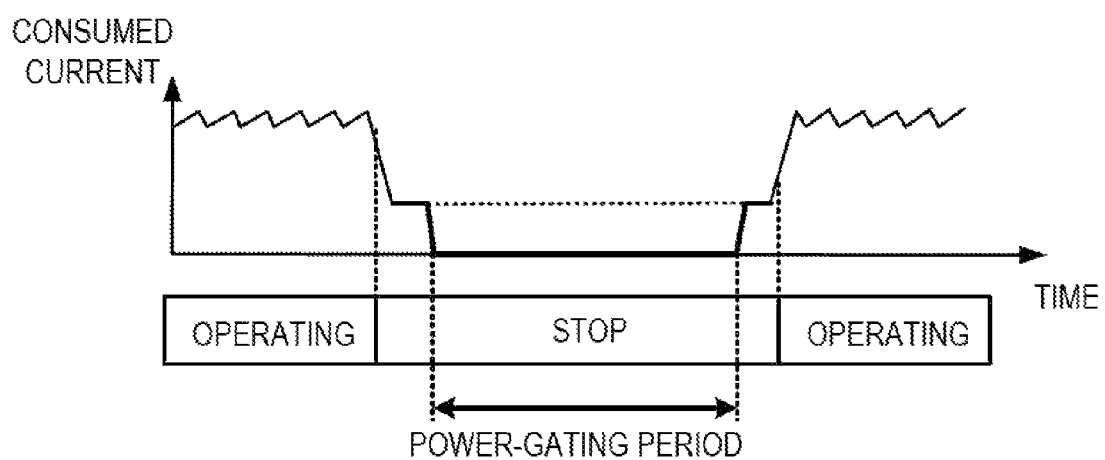
FIG. 2 illustrates an effect provided by a power-gating technique.

FIG. 2 illustrates an effect provided by the power-gating technique. Current consumption in a power-gating period in FIG. 2 is denoted by a solid line, whereas current consumption when the power gating technique is not used is denoted by a dotted line. In a semiconductor device for which the power-gating technique is used, a supply of power to circuit blocks not in use or in low-power-mode is decreased and/or prevented. Thus, the current consumption of the semiconductor device as a whole is reduced.

Figures 3A, 3B:
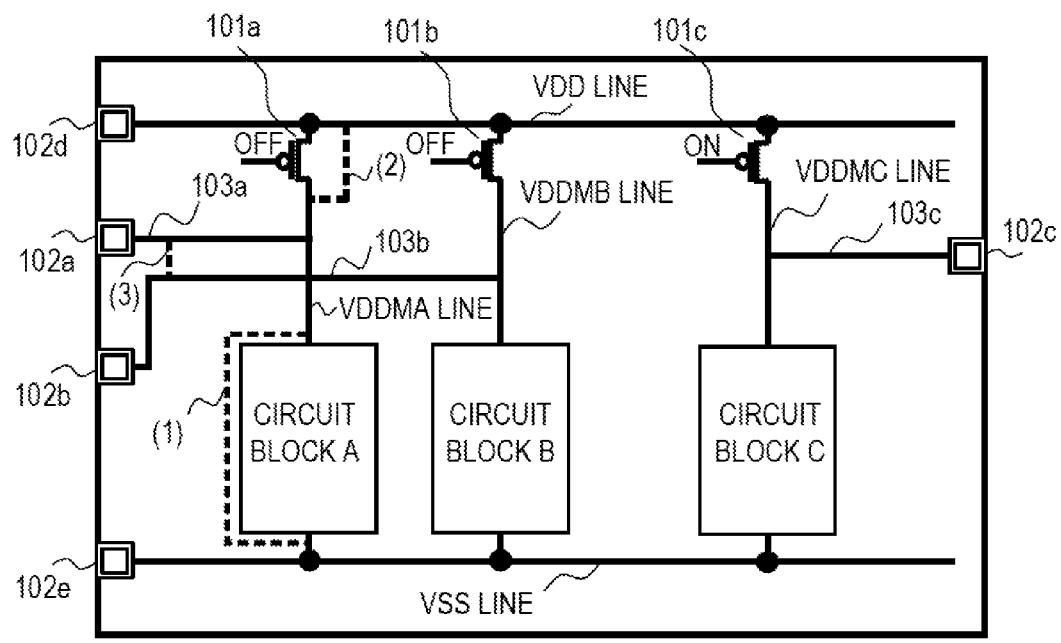
FIGS. 3A and 3B illustrate a test method for detecting a failure in a power supply line according to the related art.

FIG. 3A illustrates locations where short circuits among interconnects may occur in a semiconductor device to which the power-gating technique is applied. As illustrated in FIG. 3A, the semiconductor device being tested is provided with power supply switches 101a to 101c for switching between the ON/OFF states of power supply in association with the respective circuit blocks A to C. In FIG. 3A, only the switch 101c is turned on and, therefore, power is supplied only to the circuit block C. The other switches are turned off. Reference numerals (1), (2) and (3) in the figure denote the paths of short circuits, which may occur among the interconnects. Reference characters VDD and VSS denote power supply lines and reference characters VDDMA to VDDMC denote internal power supply lines.

Reference numeral (1) indicates that a short circuit occurs between the internal power supply line VDDMA and the power supply line VSS.

Reference numeral (2) indicates that a short circuit occurs between the internal power supply line VDDMA and the power supply line VDD.

Reference numeral (3) indicates that a short circuit occurs between the internal power supply lines VDDMA and VDDMB.

A semiconductor device in which any one of the short circuits referenced by (1) to (3) has occurred may be considered a defective unit.

FIG. 3B illustrates a test method which the inventor devised before conceiving the present invention. FIG. 3B is a table summarizing voltages to be applied to respective power supply lines when performing a test on a semiconductor device using the power-gating technique. Although only three circuit blocks are illustrated in FIGS. 3A and 3B, the number of circuit blocks is not limited to three.

In FIG. 3A, the power supply line VDD LINE is coupled to a pad 102d and the power supply line VSS LINE is coupled to a pad 102e. The internal power supply line VDDMA LINE is coupled to a test pad 102a by a lead-out line 103a. The internal power supply line VDDMB LINE is coupled to a test pad 102b by a lead-out line 103b. In the semiconductor device, a plurality of pads may be arranged in addition to the pads 102a to 102e illustrated in FIG. 3A.

As illustrated in FIG. 3B, a test voltage is applied to the test pad 102a to set the internal power supply line VDDMA to the test voltage. Test pads, other than the pad 102d, coupled to the power supply line VDD and the pads 102e and 102a coupled to the power supply line VSS are fixed to 0 V. If a current thus turn on exceeds a prescribed value, then the semiconductor device is determined as a defective unit in which a short circuit is present. Then a test voltage is applied to the test pad 102b to set the internal power supply line VDDMB to the test voltage. The power supply line VDD LINE, the power supply line VSS LINE, and test pads other than the 102b are fixed to 0 V. If a current thus turned on exceeds a prescribed value, a determination is made that a short circuit is present in the semiconductor device. Assuming that a test in which a test voltage is applied to the internal power supply line VDDMA LINE requires, for example, 100 ms, then a test time of 300 ms is used if there are three circuit blocks.

Figure 4B:
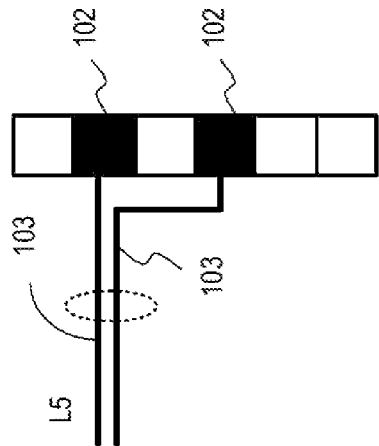
FIGS. 4A to 4C illustrate a layout of a semiconductor device provided with test pads.
Figure 4C:
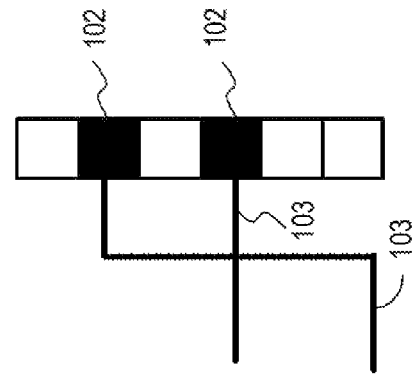
Figure 4A:
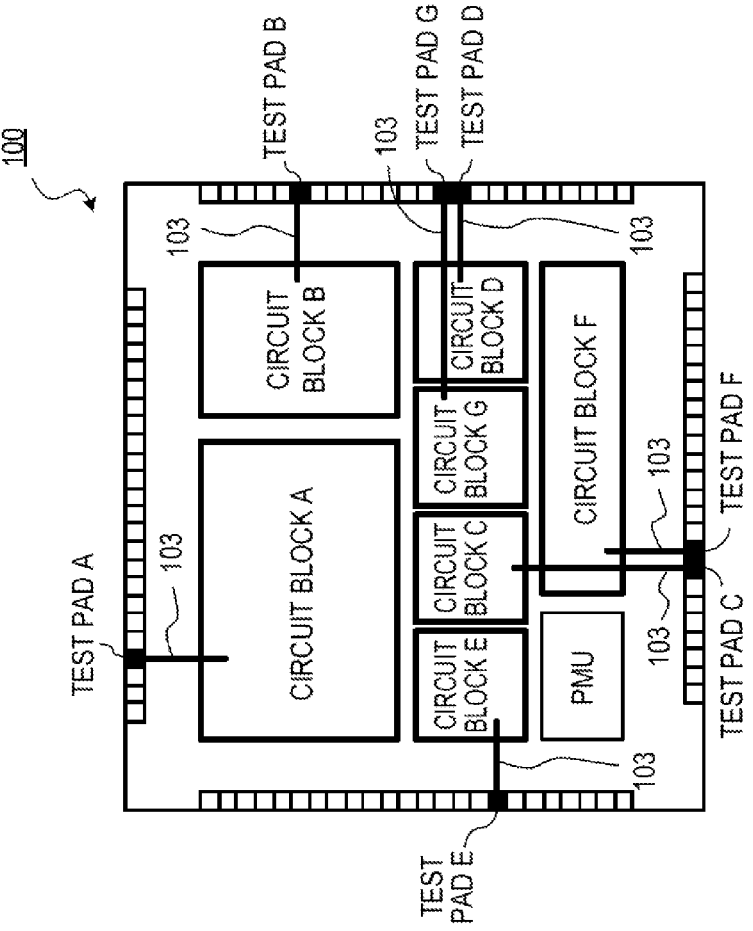

FIG. 4A illustrates one layout example of a semiconductor device 100. In FIG. 4A, internal power supply lines and test pads are coupled to each other respectively by lead-out lines 103. If test pads 102 are disposed in close proximity to each other as in a location enclosed by a dotted line in FIG. 4B, then lead-out lines 103 are also positioned in close proximity to each other. Thus, there arises the possibility that the lead-out lines short-circuit with each other. In addition, if interconnects are formed in different interconnect layers and intersect with each other three-dimensionally, as illustrated in FIG. 4C, a short circuit may occur at this intersecting point.

FIGS. 5A to 5C illustrate a layout of pads and lead-out lines of a semiconductor device 1 according to an example of an embodiment. In FIGS. 5A to 5C, a dotted line denotes a shielding line.

As illustrated in FIG. 5A, lead-out lines are laid out from circuit blocks A to F to test pads A to F, respectively. In the semiconductor device 1, these lead-out lines are shielded by shielding lines provided with a VDD or VSS potential. Shielding lines are not limited to those for covering the entire range of an interconnect. For example, only a portion of an interconnect may be shielded from another interconnect by a shielding line. It is noted that interconnects provided with a VDD or VSS potential and located lateral to the lead-out lines in the same interconnect layer as that of the lead-out lines are also referred to as shielding lines.

If a short circuit occurs between lead-out lines 3 as the result of providing shielding lines 4, the lead-out lines 3 also come into contact with the shielding lines 4. Accordingly, if any of the lead-out lines 3 comes into contact with a shielding line 4, it is possible to detect a short circuit since the potential of the shielding line 4 is VDD or VSS, for example.

As different test pads 2 to which different lead-out lines are to be coupled, it is preferable to use pads, among a plurality of pads provided in the semiconductor device, which do not abut on each other.

If lead-out lines 3 are arranged so as to intersect with each other three-dimensionally as illustrated in FIG. 5C, a short circuit is liable to occur at an intersecting point. Accordingly, the lead-out lines may be formed within the same interconnect layer, so as to avoid intersecting with each other three-dimensionally.

In order to prevent such an interconnection from being made, automatic routing may be performed by specifying that the same interconnect layer is used for all lead-out lines 3. In this case, for example, as illustrated in FIG. 5C, process such as interchanging test pads 2 in routing may be performed.

Figure 6A:
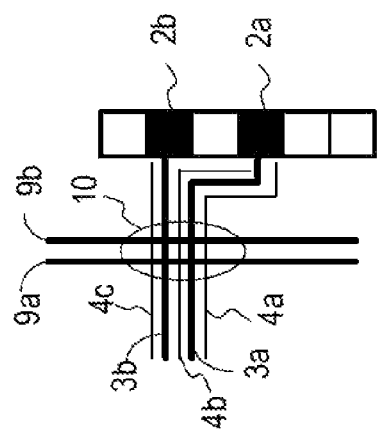
FIGS. 6A and 6B illustrate cross sections of lead-out lines and shielding lines according to in an example of an embodiment.
Figure 6B:
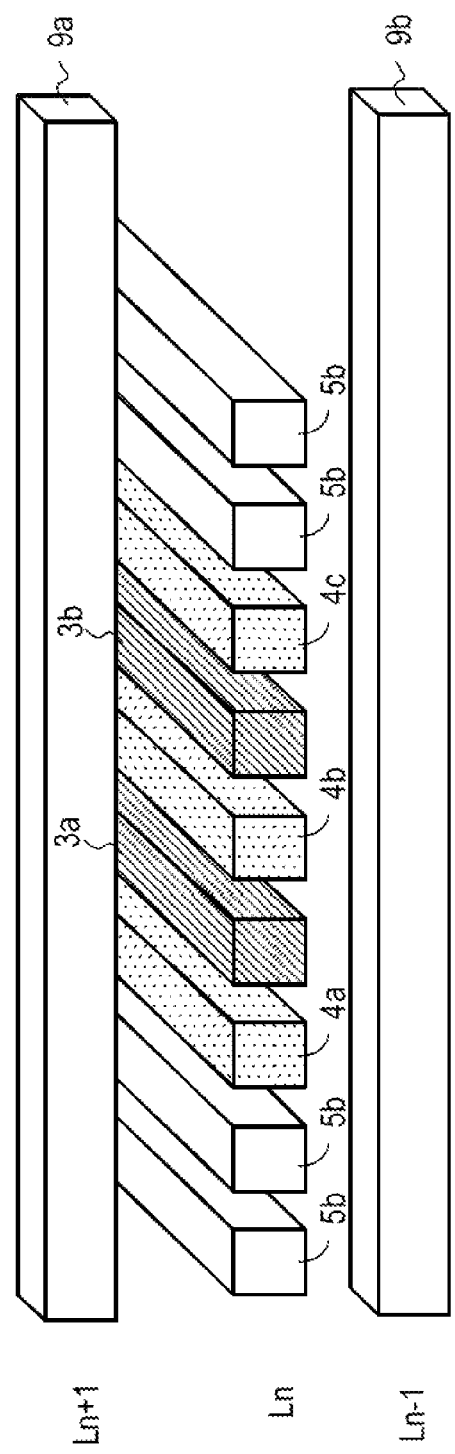

FIGS. 6A and 6B illustrate cross sections of lead-out lines and shielding lines. FIG. 6A illustrates lead-out lines 3a and 3b leading to test pads 2a and 2b, the shielding lines 4a, 4b and 4c of the lead-out lines 3a and 3b, and other interconnects 9a and 9b, such as signal lines, provided in a different layer. FIG. 6B is a cross-sectional view of a portion referenced by 10 in FIG. 6A.

In FIG. 6B, the two lead-out lines 3a and 3b are laid out in an Ln layer. The shielding line 4b is provided between these lead-out lines 3a and 3b, and the shielding lines 4a and 4c are provided adjacently with the outer sides of the lead-out lines 3a and 3b. By these shielding lines 4a to 4c, the respective lead-out lines 3a and 3b are shielded from other lead-out lines 3 and other interconnects 5b, such as signal lines, in the same interconnect layer as that of the shielding lines.

Note that the lead-out lines 3a and 3b are not shielded against other interconnects 9a and 9b in an Ln+1 layer one layer above the Ln layer and in an Ln−1 layer one layer below the Ln layer. Accordingly, there is the possibility that the lead-out lines 3a and 3b short-circuit with these interconnects.

FIGS. 7A and 7B are diagrammatic and tabular views illustrating an effect that may be obtained in a test of the semiconductor device 1 of FIG. 5. Although only three each of circuit blocks and test pads are illustrated in FIGS. 7A and 7B, the semiconductor device 1 may include many more test circuits and test pads. In FIG. 7A, a dotted line denotes a shielding line.

In the semiconductor device 100 illustrated in FIG. 4A, it is unknown between which lead-out lines 103 a short circuit may occur. Accordingly, tests must be performed in anticipation of every combination of lead-out lines 103 that may short-circuit, thus requiring a prolonged period of time.

In the semiconductor device 1 according to an example of an embodiment, a lead-out line 3, if brought into contact with a shielding line 4, is set to a VDD or VSS potential. For example, shielding lines are set to VSS and potentials illustrated in FIG. 7B are applied to the respective test pads. A test voltage is set to, for example, VDD. If a short circuit referenced by (1) or (2) occurs in the semiconductor device, a current is turned on through a test pad corresponding to a circuit block in which the short circuit is present. Thus, it is possible to detect the presence of the short circuit. Likewise, if a short circuit referenced by (3) occurs in the lead-out line 3a, a current is turned on between the lead-out line 3a and a shielding line. Thus, it is possible to detect the short circuit. As depicted in FIGS. 3A and 3B, if the same voltage is applied to the test pads 102a and 102b, it is difficult to detect the short circuit referenced by (3). As such, there has been the need to apply different potentials to the test pads 102a and 102b. In the configuration of FIG. 7, however, it is possible to detect a short circuit when applying the same potential to the test pads 2a and 2b. Accordingly, it is possible to reduce the frequency of testing according to an example of an embodiment of the present invention.

For example, as a test to detect a short circuit, a test of short-circuiting between an external power supply line, such as the power supply line VDD LINE or VSS LINE in FIG. 7, and an internal power supply line may be performed only once, irrespective of the number of circuit blocks are included in the semiconductor device 1.

As illustrated in FIG. 7B, 0 V is applied to the power supply lines VDD LINE and VSS LINE, a test voltage is simultaneously applied to a plurality of test pads including the test pads 2a and 2b for duration of, for example, 100 ms, and a current thus turned on is checked. Note that the potential of shielding lines is not limited to the potential of a power supply line or a ground potential, but may be a voltage different from the test voltage applied to the test pads.

In the semiconductor device 1 according to an example of an embodiment, rules such as not locating the test pads 2 adjacently with each other and forming all of the lead-out lines 3 in the same hierarchical layer, for example, are not essential factors.

Figure 8B:
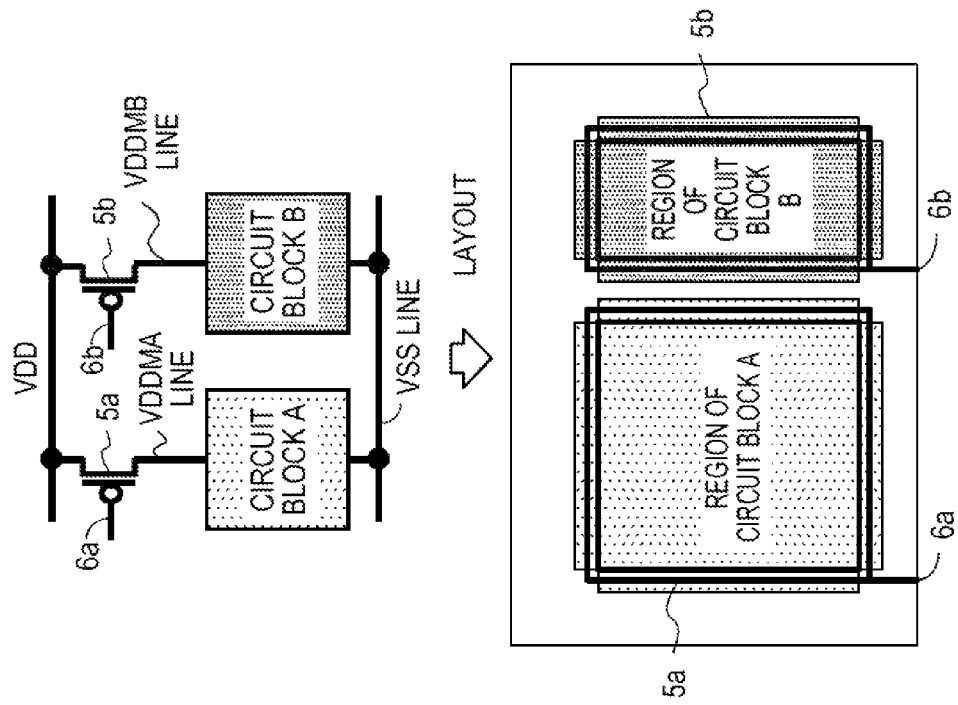
FIGS. 8A and 8B illustrate the shielding of circuit blocks of a semiconductor device according to an example of an embodiment.
Figure 8A:
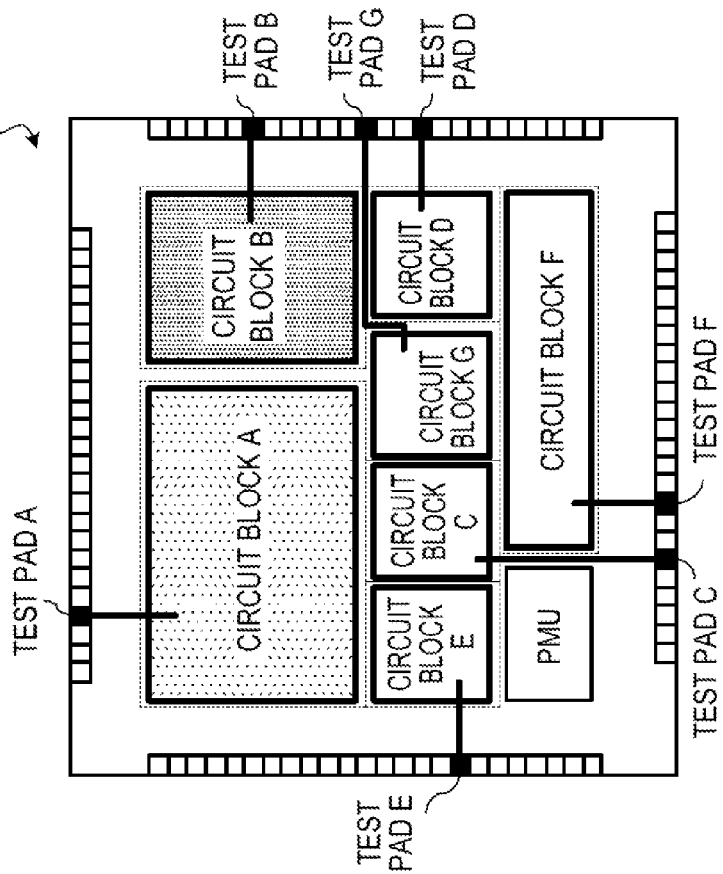

Furthermore, the semiconductor device 1 according to an example of an embodiment may be configured so that the respective circuit blocks included in the semiconductor device 1 are surrounded by shielding lines set to VDD or VSS, as illustrated in FIG. 8A. By avoiding placing the internal power supply lines, except the lead-out lines thereof, external to shielding lines, it becomes easier to obtain the effect of further reducing the frequency of testing. In FIG. 8A, a dotted line denotes a shielding line.

As an alternative, the respective circuit blocks A and B may be shielded by providing and/or surrounding the circuit blocks by power supply switches 5a and 5b for switching the ON/OFF states of power to the circuit blocks based on the control signal lines 6a and 6b of the power supply switches, as illustrated in FIG. 8B.

Note that the semiconductor device 1 according to an example of an embodiment may be realized by combining this method of shielding the respective circuit blocks illustrated in FIGS. 8A and 8B with the layouts explained using FIG. 5 in various ways. Alternatively, only the method of shielding the respective circuit blocks illustrated in FIGS. 8A and 8B may be carried out.

FIGS. 9A and 9B illustrate a circuit layout of the semiconductor device 1 according to an example of an embodiment.

In FIG. 9B, the regions of circuit blocks A and B are shielded from other circuit blocks by power supply switches 5a and 5b disposed so as to surround the regions in a ring-shaped manner. The power supply switches 5a and 5b are switched by the switch control signal lines 6a and 6b.

In addition, as depicted in FIG. 9B, lead-out lines 3a and 3b leading to the test pads 2a and 2b are shielded by shielding lines 4 having a VSS potential. Furthermore, the two lead-out lines 3a and 3b are interconnected in the same hierarchical layer and, therefore, there are no locations at which the lead-out lines intersect with each other.

In the semiconductor device 1, both of the lead-out lines led out from the circuit blocks A and B are at a VDD or VSS potential and are shielded by power supply switches 5a and 5b, which are controlled by the switch control signal lines 6a and 6b. So, short circuits occurring either between internal power supply lines of each circuit block or between lead-out lines 3 may be reduced.

Figures 10A, 10B:
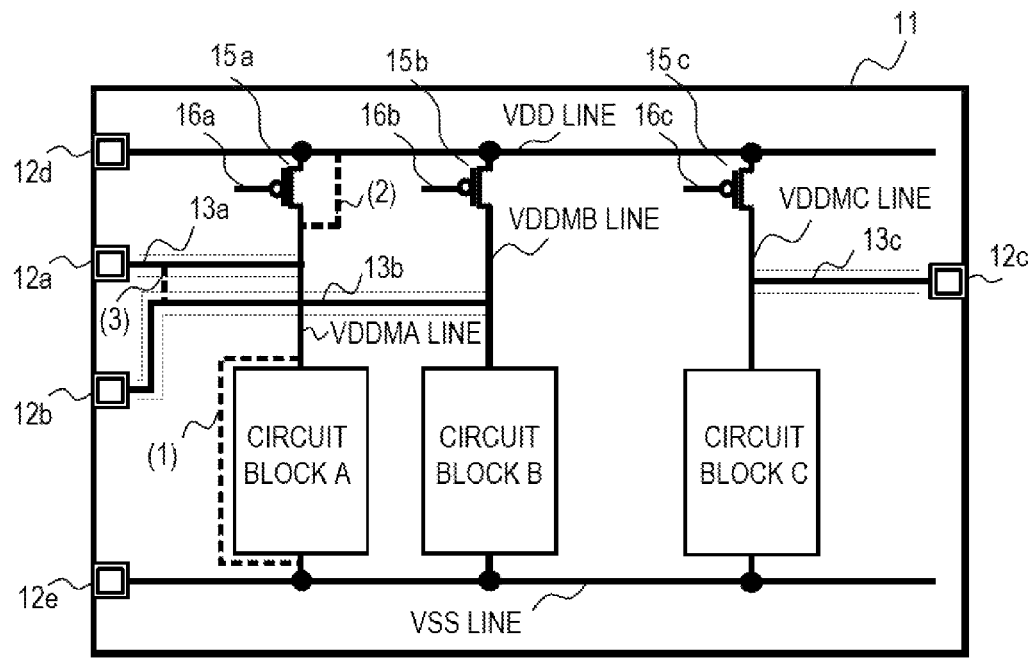
FIGS. 10A and 10B illustrate a first test method according to an example of an embodiment.

FIGS. 10A and 10B are diagrammatic and tabular views used to explain a first test method using another technique.

In a semiconductor device 11 illustrated in FIG. 10A, lead-out lines 13 are laid out from internal power supply lines on the inner sides of power supply switches 15a, 15b and 15c, the ON/OFF states of which are switched by control signal lines 16a, 16b and 16c, to test pads 12a, 12b and 12c. In this semiconductor device, every short circuit, among those referenced by (1) to (3) in FIG. 10A, may occur. Note that the number of circuit blocks is not limited to three and FIG. 10A merely is explanatory.

In the first test method, as many test voltages having different values as the number of test pads are made ready. In addition, VDD and VSS lines are grounded to 0 V, as illustrated in FIG. 10B, and test voltages 1, 2 and 3 having different voltage values are applied to test pads 12a, 12b and 12c, respectively. Then, a current thus generated is detected. If voltages are applied in this way, an overcurrent flows no matter where a short-circuited portion is present. Accordingly, once an overcurrent flows, this semiconductor device 11 is recognized as a defective unit.

In this first test method, it is possible to detect a short-circuit current no matter where a short-circuited portion is present. Thus, it is possible to perform a test in one step, thereby reducing a test time for the semiconductor device 11.

Note that in the first test method, certain potential differences for detecting short circuits is provided between respective test voltages to be applied to the test pads.

FIG. 11 is a diagrammatic view used to explain a second test method. In the second test method, attention is paid to whether or not circuit blocks included in a semiconductor device are adjacent to one another. Lead-out lines led out from circuit blocks not adjacent to each other are distant from each other and are, therefore, determined as being free from the possibility of short-circuiting. Consequently, the internal power supply lines of circuit blocks not adjacent to each other are tested at the same time.

In the second test method, the routing regions of respective circuit blocks are extracted from layout data obtained at the time of performing the layout design of the semiconductor device 11. Then, combinations of adjacent circuit blocks are determined from these routing regions. The test method determines that it is permitted to simultaneously apply a voltage to non-adjacent circuit blocks, i.e., circuit blocks in which the lead-out lines are free or substantially free from the possibility of short-circuiting with each other. Concurrently, the test method generates a test program for performing tests by simultaneously applying a voltage to a plurality of test pads. Thus, a test is performed by executing this test procedure and/or program.

In FIG. 11, a circuit block A abuts on circuit blocks B, C, E and G, and the circuit blocks D and F are not adjacent to the circuit block A, but do abut on each other. Likewise, the circuit block B abuts on the circuit blocks A, D and G, and the circuit blocks C and E, among the circuit blocks C, E and F are not adjacent to the circuit block B, but C and E do abut each other. This determination is made in a repetitive manner. In FIG. 11, there is performed a four-step test in which a voltage is simultaneously applied to the test pads of the circuit blocks A and D, the test pads of the circuit blocks B and C, the test pads of the circuit blocks E and F, and the test pad of the circuit block G.

In the second test method, a test of such a semiconductor device as illustrated in FIG. 11 may be reduced to four steps by detecting a plurality of test pads to which a voltage may be applied at the same time.

This second test method, like the first test method, may be used for all types of semiconductor device 11 to be tested. In addition, whereas the first test method may be restricted in the number of circuit blocks included in the semiconductor device 11, the second test method is not restricted in this manner. Furthermore, only one voltage value may be used for tests. Still furthermore, the technique described heretofore is applicable to a semiconductor device which is equipped with power supply switches and uses the power-gating technique, and other semiconductor devices, including a multiple power-driven semiconductor device driven by the input of a plurality of voltage values.

In the case of a multiple power-driven semiconductor device, power consumption may be unduly high if a power supply voltage of, for example, 1.2 V is uniformly applied to a chip even though the 1.2 V may not be necessary to perform a desired operation. Accordingly, a voltage lower than the power supply voltage, for example, 0.8 V is applied to circuit blocks capable of performing desired operation even at lower voltages, thereby achieving a low-power operation. In the multiple power-driven semiconductor device, different power supply voltages minimally necessary for the respective circuit blocks are applied thereto, in order to suppress the power consumption of the semiconductor device as a whole.

Figures 12A, 12B:
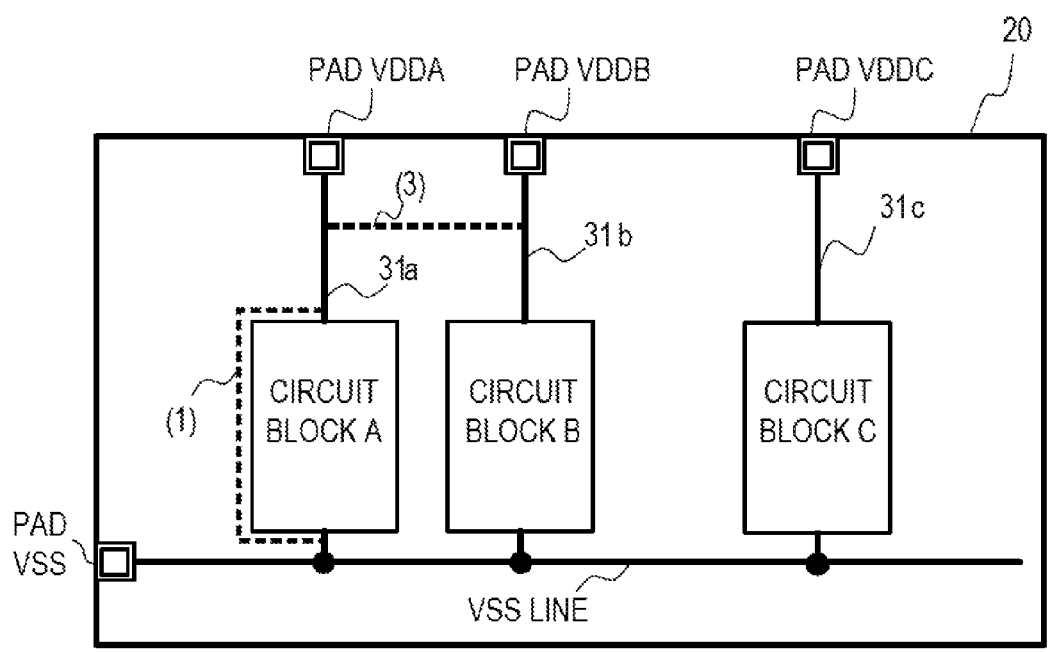
FIGS. 12A and 12B illustrate a multiple power-driven semiconductor device.

FIGS. 12A and 12B illustrate a multiple power-driven semiconductor device.

In FIG. 12A, a semiconductor device 20 is comprised of a plurality of circuit blocks, including circuit blocks A, B and C, and voltage values VDDA, VDDB and VDDC are applied to the respective circuit blocks. In the semiconductor device 20, assume that there is performed a test to detect short circuits at locations referenced by (1) and (3) in FIG. 12A. Then, a step of applying a test voltage to one of the circuit blocks A, B and C and grounding the voltages of a VSS line and other circuit blocks to 0 V, as illustrated in FIG. 12B, and then checking a current thus turned on is be carried out as many times as the number of voltage values.

Figure 13:
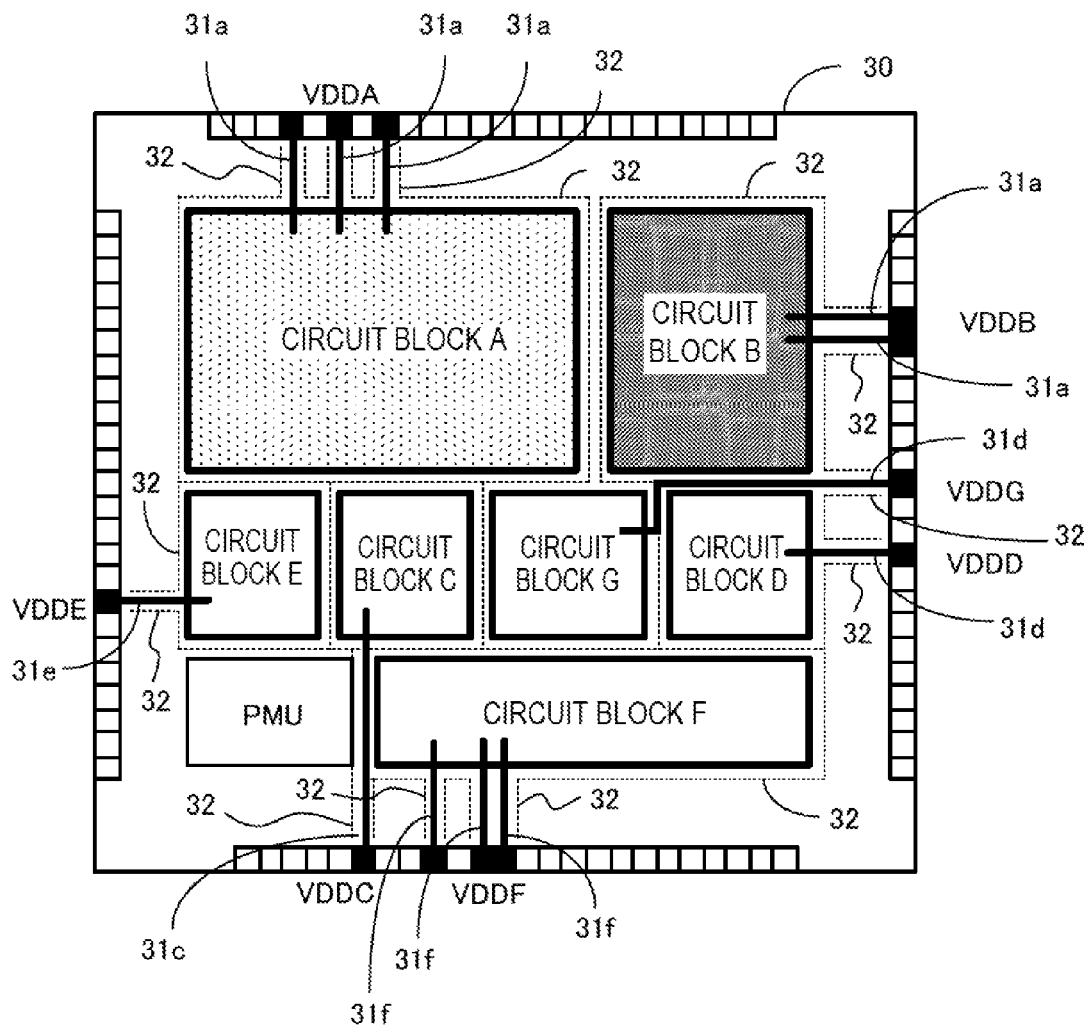
FIG. 13 illustrates a layout in a case where an an example of an embodiment is applied to a multiple power-driven semiconductor device.

FIG. 13 illustrates a layout example of a multiple power-driven semiconductor device.

As illustrated in FIG. 13, in a multiple power-driven semiconductor device 30, power to respective circuit blocks is supplied from external power supply pads. In FIG. 13, a dotted line denotes a shielding line.

The semiconductor device 30 is configured under the rules that, e.g., (1) external power supply lines 31a to 31f from the respective circuit blocks to the respective external power supply pads VDDA to VDDF are all laid out in the same interconnect layer; (2) the external power supply lines 31 are shielded by VSS lines 32 in such a manner that the VSS lines abut on both sides of each external power supply line; (3) the power supply pads VDDA to VDDF to be set to different voltages are disposed so as not to abut on one another; and (4) the respective circuit blocks A to F are shielded so as to be surround by VSS lines 32.

All of these rules (1) to (4) need not be applied. For example, only rule (2) may be applied.

Figures 14A, 14B:
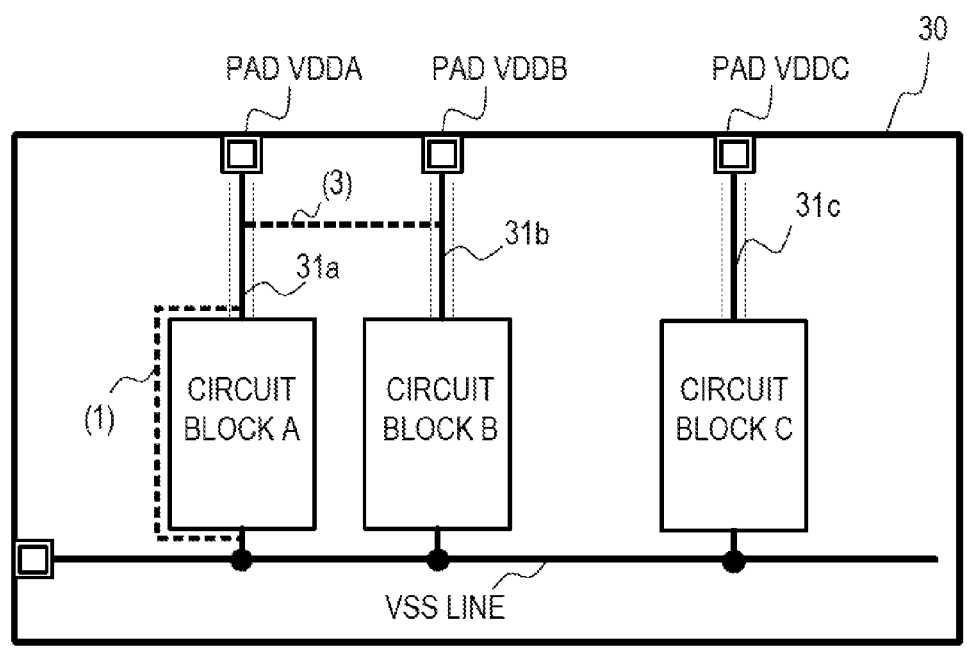
FIGS. 14A and 14B illustrate effects in a case where an example of an embodiment is applied to a multiple power-driven semiconductor device.

In the semiconductor device 30 illustrated in FIG. 14A, the power supply pads VDDA, VDDB and VDDC are used as test pads to perform a test to detect a short circuit in the power supply lines 31 by applying a test voltage using a testing apparatus. In FIG. 14A, a dotted line denotes a shielding line.

As illustrated in FIG. 14B, it is possible to perform a test in one step by grounding the VSS line to 0 V, and simultaneously applying the same test voltage to other power supply pads VDDA, VDDB and VDDC, and examining a current thus generated.

FIGS. 15A and 15B are diagrammatic and tabular views used to explain a case in which the first test method of an embodiment is applied to a multiple power-driven semiconductor device.

In a multiple power-driven semiconductor device 40 illustrated in FIG. 15A, different voltages are supplied to respective circuit blocks. In this multiple power-driven semiconductor device, a short circuit may occur at both of locations referenced by (1) and (3) in FIG. 15A.

If the first test method of an example of an embodiment is applied, as many test voltages having different values as the number of the drive voltages of the semiconductor device 40 are made ready, the VSS line is grounded to 0 V as illustrated in FIG. 15B, test voltages 1, 2 and 3 respectively having different voltage values are applied to respective test pads, and currents thus activated are detected. If voltages are applied in this way, an overcurrent flows no matter where a short-circuited portion is present. Accordingly, once an overcurrent flows, this semiconductor device 11 is recognized as a defective unit.

FIG. 16 is a diagrammatic view used to explain a case in which the second test method of an example of an embodiment is applied to a multiple power-driven semiconductor device.

In a case in which the second test method is applied to a multiple power-driven semiconductor device 40, the routing regions of respective circuit blocks are extracted from layout data obtained at the time of performing the layout design of the semiconductor device 40. Then, combinations of adjacent circuit blocks are determined from these routing regions. The test method determines that it is permitted to simultaneously apply voltages to non-adjacent circuit blocks, the external power supply lines of which are free from the possibility of short-circuiting with each other. Concurrently, the test method generates a test procedure and/or program for performing a test by simultaneously applying a voltage to a plurality of power supply pads. Thus, the test is performed by executing this test procedure and/or program.

In FIG. 16, it is understood that a circuit block A abuts on circuit blocks B, C, E and G, and circuit blocks D and F are not adjacent to the circuit block A, however, abut each other. Likewise, it is understood that the circuit block B abuts on the circuit blocks A, D and G, and the circuit blocks C and E, among the circuit blocks C, E and F not adjacent to the circuit block B, however, circuit blocks C and E abut each other. This determination is made in a repetitive manner. In FIG. 16, there is performed a four-step test in which a voltage may be simultaneously applied to the power supply pads of the circuit blocks A and D, the power supply pads of the circuit blocks B and C, the power supply pads of the circuit blocks E and F, and the power supply pad of the circuit block G. Then, a test voltage is applied to all of the power supply pads.

An explanation will be made of a testing apparatus used in a test performed according to an example of an embodiment.

FIG. 17A is one example of an image drawing of a testing apparatus used according to an example of an embodiment.

The testing apparatus 50 illustrated in FIG. 17A includes a power generation section 51, a power switching section 52, a test control section 53, and a plurality of current measurement sections 54a to 54d.

The power generation section 51 generates voltages to be applied to a semiconductor device 60 being tested, according to an instruction from the test control section 53. The power switching section 52 makes a selection, according to an instruction from the test control section 53, as to which pad, among the pads of the semiconductor device 60 being tested, a test voltage from the power generation section 51 is applied. The test control section 53 includes a memory inside and, for example, reads a program from a portable storage medium into the memory and reads data from a communications network into the memory. The test control section 53 controls the testing apparatus 50 as a whole based on a test program read into the memory. The plurality of current measurement sections 54a to 54d are provided so as to agree with the number of pads whereby the testing apparatus 50 applies voltages to the semiconductor device 60 being tested. The current measurement sections measure currents turned on when the testing apparatus 50 applies test voltages to the semiconductor device 60.

In the testing apparatus 50 configured as described above, the test control section 53 grounds VDD and VSS lines to 0 V, applies voltages to the respective test pads VDDMA to VDDMD, and detects currents turned on through the respective pads by the plurality of current measurement sections 54a to 54d, based on the test program.

When performing a test according to the second test method, the testing apparatus performs the test by applying voltages to the test pads in the order based on the layout data of the semiconductor device and detects currents turned on through the respective pads by the plurality of current measurement sections 54a to 54d.

Note that the testing apparatus for carrying out the first test method includes a voltage generation section capable of simultaneously generating a plurality of voltage values. A test may be performed using this testing apparatus by simultaneously applying a plurality of voltage values to the respective test pads and detecting currents thus generated.

If the semiconductor device 60 being tested is a multiple power-driven semiconductor device, only the VSS line is grounded to 0 V, and test voltages are respectively applied to power supply pads, for example.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A test method comprising:
preparing a semiconductor device including a first circuit block, a second circuit block, a first lead-out line coupled to the first circuit block, a second lead-out line coupled to the second circuit block, a first pad coupled to the first lead-out line, a second pad coupled to the second lead-out line, first shielding lines which are provided at both sides of the first lead-out line respectively and are adjacent to the first lead-out line and second shielding lines which are provided at both sides of the second lead-out line respectively and are adjacent to the second lead-out line;
applying a test voltage to both the first pad and the second pad to perform a short-circuit test of the semiconductor device; and
monitoring for a leakage current flowing through at least one of the first shield lines and the second shield lines.

2. The test method according to claim 1, wherein the applying simultaneously applies a test voltage to both the first pad and the second pad to perform the short-circuit test of the semiconductor device.

3. The test method according to claim 1, wherein the short-circuit test is performed by fixing at least one of the first shielding lines and the second shielding lines to a first potential different from the test voltage.

4. A test method comprising:
preparing a semiconductor device including a first circuit block, a second circuit block, a first external power supply line coupled to the first circuit block, a second external power supply line coupled to the second circuit block, a first pad coupled to the first external power supply line, a second pad coupled to the second external power supply line, first shielding lines which are provided at both sides of the first external power supply line respectively and are adjacent to the first lead-out line and second shielding lines which are provided at both sides of the second external power supply line respectively and are adjacent to the second lead-out line;
applying a test voltage to both the first pad and the second pad to perform a short-circuit test of the semiconductor device; and
monitoring for a leakage current flowing through at least one of the first shield lines and the second shield lines.

5. The test method according to claim 4, wherein the applying simultaneously applies a test voltage to both the first pad and the second pad to perform the short-circuit test of the semiconductor device.

6. The test method according to claim 4, wherein the short-circuit test is performed by fixing at least one of the first shielding lines and the second shielding lines to a first potential different from the test voltage.

* * * * *